United States Patent
Hohe et al.

(10) Patent No.: US 6,768,301 B1
(45) Date of Patent: Jul. 27, 2004

(54) HALL SENSOR ARRAY FOR MEASURING A MAGNETIC FIELD WITH OFFSET COMPENSATION

(75) Inventors: Hans-Peter Hohe, Heiligenstadt (DE); Norbert Weber, Weissenohe (DE); Josef Sauerer, Herzogenaurach (DE)

(73) Assignee: Fraunhofer-Gesellschaft zur Foerderung der Angewandten Forschung e.V., Munich (DE)

( * ) Notice: Subject to any disclaimer, the term of this patent is extended or adjusted under 35 U.S.C. 154(b) by 104 days.

(21) Appl. No.: 10/088,069

(22) PCT Filed: Sep. 8, 2000

(86) PCT No.: PCT/EP00/08805

§ 371 (c)(1),
(2), (4) Date: Aug. 12, 2002

(87) PCT Pub. No.: WO01/18556

PCT Pub. Date: Mar. 15, 2001

(30) Foreign Application Priority Data

Sep. 9, 1999 (DE) .......................................... 199 43 128

(51) Int. Cl.⁷ .............................................. G01R 33/06
(52) U.S. Cl. ...................................... 324/251; 324/225
(58) Field of Search ............................ 324/202, 207.2, 324/225, 251, 260; 338/32 H; 327/511

(56) References Cited

U.S. PATENT DOCUMENTS

| | | | |
|---|---|---|---|
| 4,668,914 A | 5/1987 | Kersten et al. | |
| 5,406,202 A | * 4/1995 | Mehrgardt et al. | .......... 324/251 |
| 5,747,995 A | 5/1998 | Spies | |
| 5,844,427 A | * 12/1998 | Theus et al. | .................. 327/51 |
| 6,362,618 B1 | * 3/2002 | Motz | .......................... 324/251 |
| 6,433,544 B1 | * 8/2002 | Motz | .......................... 324/251 |

FOREIGN PATENT DOCUMENTS

| | | |
|---|---|---|
| DE | 43 02 342 A1 | 7/1993 |
| EP | 0 548391 B1 | 6/1993 |
| EP | 0 704 710 A1 | 4/1996 |
| WO | WO 99/21023 | 4/1999 |

OTHER PUBLICATIONS

Translation of International Preliminary Examination Report for Intl. App. No. PCT/EP00/08805 dated Dec. 5, 2001.
Copy of International Search report (in German) dated Dec. 21, 2000.

* cited by examiner

Primary Examiner—Jay Patidar
(74) Attorney, Agent, or Firm—Welder, Price, Kaufman & Kammholz, P.C.

(57) ABSTRACT

A Hall sensor array for offset-compensated magnetic field measurement comprises a first and at least one additional pair of Hall sensor elements. Each Hall sensor element has four terminals, of which two act as power supply terminals for supplying an operating current and two act as measurement terminals for measuring a Hall voltage. Respective first supply terminals of each Hall sensor element are connected together and to a first terminal of a common voltage source and respective second supply terminals of each Hall sensor element are connected together and to a second terminal of the common voltage source so that the common voltage source supplies an operating current for the Hall sensor elements. The Hall sensor elements are operated in the spinning current mode so that the offset voltages of the Hall sensor elements approximately cancel one another out in a revolution so that the Hall signal contributions which actually depend on the magnetic field remain.

4 Claims, 4 Drawing Sheets

HALL SENSOR ARRAY FOR MEASURING A MAGNETIC FIELD WITH OFFSET COMPENSATION

BACKGROUND OF THE INVENTION

1. Field of the Invention

The present invention relates generally to Hall sensors and in particular to the arrangement and control of several Hall sensor elements in a Hall sensor array for magnetic field measurement with offset compensation.

2. Description of Prior Art

An individual Hall sensor element generally consists of an n-doped active semiconductor region on a p-doped semiconductor substrate. The n-doped active region is normally connected to an external control logic via four contact electrodes or contact terminals which are arranged diagonally opposite one another in the active region. The four contact electrodes of the Hall sensor element subdivide into two facing control current contact electrodes, which serve to generate a current flow through the active region, and two facing voltage tapping contact electrodes, which serve to tap a Hall voltage, which arises when a magnetic field is applied at right angles to the current flow in the active region, to act as a sensor signal.

A Hall sensor array in which two or four Hall sensor elements are used to compensate the disturbing effect of a particular crystal direction is know frown the European patent specification EP-0548391 B1. The angular separation of the individual Hall sensor elements is fixed, lying between 0° and 180°. The angle is chosen according to the crystal direction of the semiconductor material which is used. According to EP-0548391 each Hall element is fed from a separate current source, so that a constant current is impressed on each element. The Hall voltages tapped off at the individual Hall elements in the Hall detector are connected in parallel in a switching stage. A common value is thus imposed on the Hall voltages of the individual elements, so that compensating currents may result.

As is known, inhomogeneities or faults in the semiconductor material of the active region often arise in the manufacturing processes of semiconductor structures due to the nature of production. Even with very refined manufacturing methods, these inhomogeneities cannot be avoided completely. These inhomogeneities are often the cause of an offset of the sensor signal. This means that a sensor signal is detected at the contact electrodes at which the Hall voltage is tapped off even when no magnetic field is being applied to the active region. This disturbing sensor signal is termed the offset of the useful sensor signal or simply the offset signal. Owing to the strong dependence of the offset signal on the inhomogeneities, traditional Hall sensor elements are subject to considerable scatter from one element to another. In addition there is a marked adverse effect or the sensitivity and measurement accuracy of the Hall sensors. For this reason, offset compensation and the correct evaluation or the sensor signals generally entail a costly circuit investment.

So-called piezo effects, which are strongly dependent on the crystal direction of the semiconductor material used, constitute another problem area in Hall sensor arrays. These piezo effects can produce a considerable offset signal through mechanical stresses caused by external forces (e.g. due to the housing) or through mechanical stresses in the crystal lattice of the semiconductor material. Attempts have been made to overcome these problems, either by matching the Hall sensor array to the crystal direction of the semiconductor material or by compensating the piezo effects through a suitable choice of the current directions in the semiconductor material depending on the crystal direction. However, these measures involve very complicated manufacturing processes for the Hall sensor arrays since it is necessary to take into account both the crystal orientation of the semiconductor surface and also the orientation of the Hall sensor elements to one another and in relation to the crystal orientation.

SUMMARY OF THE INVENTION

It is the object of the present invention to provide an improved Hall sensor array which is also less complicated to manufacture.

This object is achieved by a Hall sensor array comprising:

a first and at least one additional pair of Hall sensor elements, wherein each Hall sensor element has four terminals, of which two terminals act as power supply terminals for supplying an operating current and two terminals act as measurement terminals for measuring a Hall voltage, wherein the Hall sensor elements are so arranged that the current directions of the operating current in the two Hall sensor elements of each pair are offset at an angle of approximately 90° to one another, wherein the Hall sensor elements of the additional pair(s) are so arranged that their current directions of the operating current are offset at an angle of approximately 90°/n to the current directions of the operating current of the first pair of Hall sensor elements, n being the total number of Hall sensor element pairs, and wherein respective first terminals of the measurement terminals of the Hall sensor elements and respective second terminals of the measurement terminals of the Hall sensor elements are connected together for measurement of the Hall voltage, wherein the Hall sensor array also has switches and wherein the respective terminals of the Hall sensor elements are connected to the switches, so that the respective first and second supply terminals for supplying an operating current and the respective first and second measurement terminals for measuring a Hall voltage can be switched over from one measurement to a subsequent measurement in such a way that the current directions of the operating current in the Hall sensor elements and the Hall voltage tapping directions can be rotated through approximately 90° from one measurement to a subsequent measurement, wherein the Hall sensor array also has a controller by means of which the switches are controllable in such a way that the Hall sensor array is operable in spinning current operation for generating a Hall signal and wherein the offset voltages of the Hall sensor elements approximately cancel one another out in a revolution so that the Hall signal contributions which actually depend on the magnetic field remain, and wherein respective first supply terminals of each Hall sensor element are connected together and to a first terminal of a common voltage source and respective second supply terminals of each Hall sensor element are connected together and to the second terminal of the common voltage source so that the common voltage source supplies an operating current for the Hall sensor elements.

The present invention is based on the finding that the sensor signal offset contribution in a Hall sensor array can be greatly reduced through the above geometrical arrangement of the individual Hall sensor elements of the pairs and the interwiring of the terminals, making it possible to supply an offset signal which is already precompensated. With the arrangement and interwiring of the Hall sensor elements according to the present invention it is possible to make the measured Hall voltage independent of the crystal direction of the semiconductor material.

According to the present invention, the Hall sensor elements are operated in the so-called "spinning current" mode. In spinning current operation the measurement direction is rotated continuously in a cycle by e.g. 90° at a particular clock frequency, i.e. the operating current flows from one electrode to the facing contact electrode, the Hall voltage being tapped off at the transverse contact electrodes, whereupon the measurement direction is rotated through 90° at the next cycle, i.e. the next measurement phase. The Hall voltages measured in the individual measurement phases are evaluated by a suitable correctly signed and weighted summation or subtraction. The offset still contained in the individual measurement phases can be reduced still further or the offset voltages during a revolution should roughly cancel one another out, so that the parts of the Hall signal which really depend on the magnetic field are retained.

Because of the orientation and interwiring of the Hall sensor elements according to the present invention it is no longer necessary to take the crystal direction of the semiconductor material into account, whereby the influence on the measured Hall voltage of the piezo effects dependent on the crystal direction of the semiconductor material can effectively be eliminated completely.

Since the strong dependence of the offset signal both on the crystal direction of the semiconductor material and on the inhomogeneties and irregularities in the semiconductor material is effectively eliminated by the Hall sensor array according to the present invention, a considerable increase in the sensitivity and measurement accuracy is achieved by means of this Hall sensor array. This permits the complexity of the circuitry needed for correct evaluation and further processing of the sensor signals to be reduced in the Hall sensor array according to the present invention.

The improved sensitivity and measurement accuracy resulting from the lower offset contribution of the sensor signal of the Hall sensor array also results in an increase in the exploitable resolution of the measured Hall voltage.

A further advantage of the present invention is that the circuit complexity of the Hall sensor array can be reduced further since the fixed interwiring of the Hall sensor elements makes it possible to apply a common operating current to all the Hall sensor elements and to have a common tap-off for all the Hall signals of the Hall sensor elements. This avoids the need to supply a separate operating current to each sensor element individually and to measure separately the Hall voltage of each sensor element. This avoids the need for additional circuit components, e.g. additional switches, current sources, feed lines, etc. Furthermore, the complexity of the evaluation circuit can be simplified.

BRIEF DESCRIPTION OF THE DRAWINGS

Preferred embodiments or the present invention are discussed in more detail below making reference to the enclosed drawings, in which.

DESCRIPTION OF THE PREFERRED EMBODIMENTS OF THE INVENTION

The general structure of a Hall sensor array with two pairs of Hall sensor elements will now be described making reference to FIG. 1.

On a semiconductor substrate, which is preferably p-doped, four rectangular active semiconductor regions are introduced, these usually being n-doped. Contact electrodes K1, K2, K3, K4, which are generally obtained by $n^+$-doping, are preferably arranged in the corners of the n-doped active region. The contact electrodes K1, K2, K3, K4 in the n-doped active region are arranged diagonally opposite each other in pairs, two contact electrodes K1, K3 serving to feed in the operating current and the other two contact electrodes K2, K4 to tap off the Hall voltage. The active regions constitute the individual Hall sensor elements 1A, 2A, 1B, 2B. In the Hall sensor array with four Hall sensor elements shown in FIG. 1 the Hall sensor elements 1A, 1B and the Hall sensor elements 2A, 2B respectively constitute a Hall sensor element pair.

Figure 1:
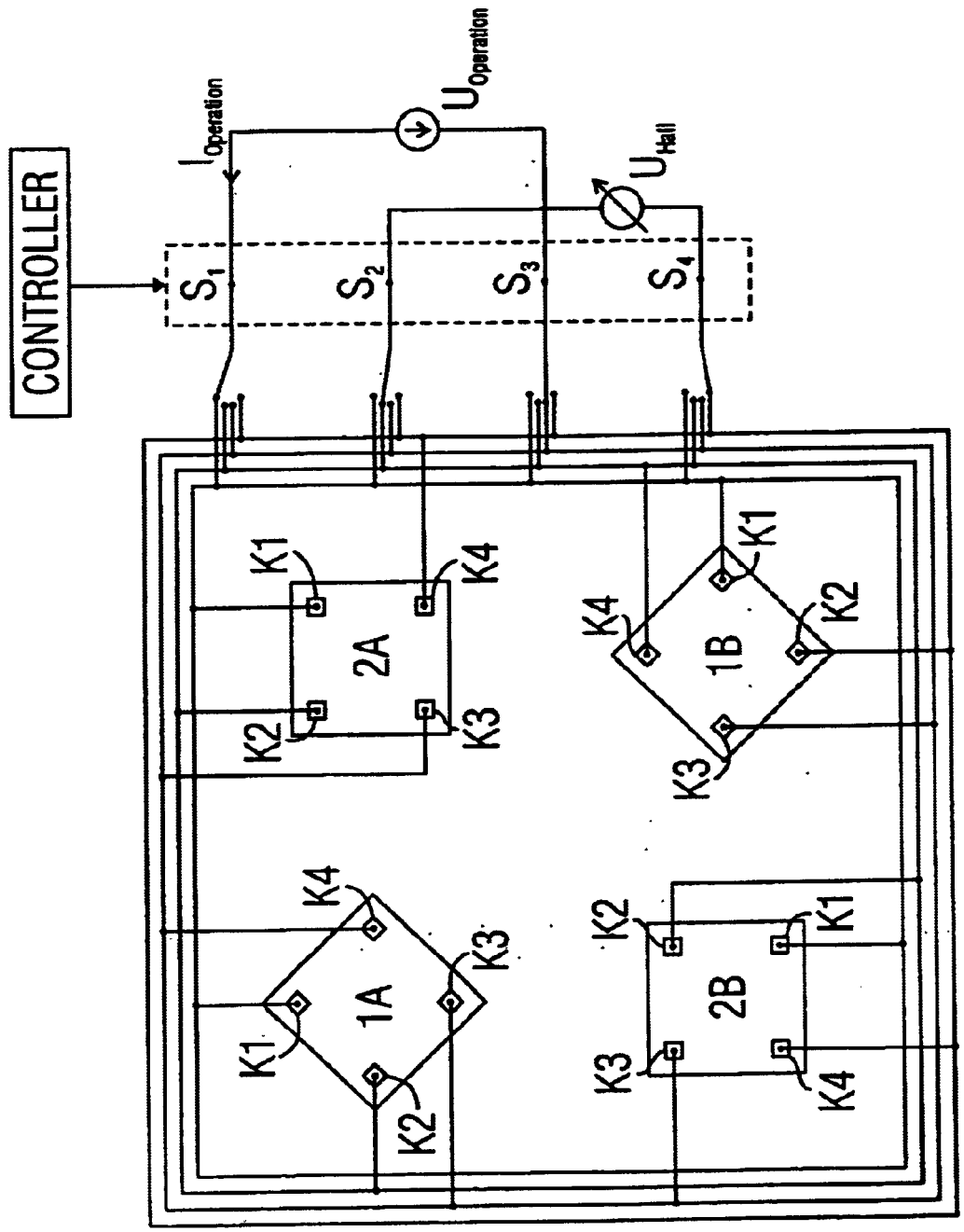
FIG. 1 shows a schematic representation of a Hall sensor array with four Hall sensor elements according to the present invention.

FIG. 1 shows an embodiment in which the two Hall sensor element pairs are positioned in a square, the individual pairs of hall sensor elements being arranged diagonally. However, the two Hall sensor elements or a pair in the Hall sensor array can also be positioned one below the other or next to each other.

In a preferred embodiment of the Hall sensor array according to the present invention the contact electrodes K1, the contact electrodes K2, the contact electrodes K3 and the contact electrodes K4 of the individual Hall sensor elements 1A, 2A, 1B, 2B are respectively connected in parallel and are wired together without intermediate switches. In the representation shown the contact electrodes K1 and the contact electrodes K3 of the Hall sensor elements 1A, 2A, 1B, 2B constitute the current feed contacts while the contact electrodes K2 and the contact electrodes K4 of the Hall sensor elements 1A, 2A, 1B, 2B provide the measurement terminals for measuring a Hall voltage. The contact electrodes for feeding in an operating current and the contact electrodes for measuring a Hall voltage are so arranged in the individual Hall sensor elements that the current direction of the impressed operating current is in each case perpendicular to the direction of the tapped Hall voltage.

In preferred embodiments of the present invention the operating current directions in the two Hall sensor elements of each pair are oriented at 90° to each other. The current directions of the second Hall sensor element pair are offset at an angle of 45° to the current directions of the first Hall sensor element pair.

In the practical implementation of the Hall sensor array according to the present invention the angle at which the operating current directions in the two Hall sensor elements of each pair are oriented to one another can deviate from the ideal value of 90° and lie in a range of e.g. 80° to 100°, angles in this range being regarded as angles of essentially 90° in the sense of the present invention. This applies also to the angle by which the current directions of the second Hall sensor element pair are offset relative to the current directions of the first Hall sensor element pair, which can be chosen to be e.g. in the range 40° to 50° and thus effectively equal to 45°. It should be noted, however, that the offset compensation of the Hall sensor array which is achieved may decrease with increasing deviation from the ideal angles considered as optimal, namely 90° and 45°.

The rigidly interwired contact electrodes K1, K2, K3, K4 of the Hall sensor elements 1A, 2A, 1B, 2B are connected to switches S1, S2, S3, S4, each of which can be switched between four positions, i.e. between the contact electrodes K1, K2, K3, K4. With the switches S1, S2, S3, S4 the contact electrodes K1, K2, K3, K4 can respectively be switched over together to act as power supply terminals for supplying an operating current $I_{operation}$ or as measurement terminals for measuring a Hall voltage $U_{Hall}$.

A further embodiment of the Hall sensor array according to the present invention (not shown explicitly) can provide more than two pairs of Hall sensor elements. In this case, too, the operating current directions in the two Hall sensor elements of each pair are oriented substantially at 90° to each other. Here, too, the two Hall sensor elements of each pair must be geometrically the same and be close to one another relative to the dimensions of the Hall sensor elements and they can be arranged one under the other, next to each other or along a diagonal in the complete sensor array. The current directions of the two or more Hall sensor element pairs are respectively oriented at an angle of essentially 90°/n to one another, n being the total number of Hall sensor element pairs which are used and n≧2. For example, if three Hall sensor element pairs are used, the current directions of the individual Hall sensor element pairs are offset at an angle of approximately 30° to each other. The element pairs of the sensor array are arranged either next to each other or along the diagonal, the pairs of Hall sensor elements being as close to one another as possible.

In this arrangement, too, the contact electrodes for supplying an operating current $I_{operation}$ (or a supply voltage) and also the contact electrodes for tapping the Hall voltage $U_{Hall}$ are connected in parallel and rigidly wired together without intervening switches.

Through the Hall sensor array with two pairs of Hall sensor elements, see FIG. 1, or with several pairs of Hall sensor elements according to the present invention the geometric placing of the Hall sensor elements already results in a precompensated offset signal in each measurement phase. This means e.g. that a subsequent amplifier can be operated with higher amplification since it cannot so easily become saturated. Through the cyclic changeover (e.g. spinning current operation) of the operating current directions and a suitable correctly signed and weighted summation or subtraction of the signals of the individual measurement phases, the precompensated sensor signal offset contribution which still remains in the individual measurement phases during spinning current operation is reduced further since the sensor signal offset contributions due to inhomogeneities and stresses in the semiconductor material are substantially eliminated.

The specified geometric arrangement of the sensors is advantageous here since the offset contribution of a single Hall sensor element with only four terminals is smaller than that of a Hall sensor element with a different geometry, e.g. with eight contact electrodes. The resulting offset contribution which remains after cyclic changeover and weighting is therefore also smaller. With its geometric arrangement for the Hall sensor array and employing the spinning current method the arrangement according to the present invention provides a Hall voltage with an extremely small offset contribution. This Hall voltage is also independent of the crystal direction used in the Hall sensor array manufacturing process and of the orientation of the Hall sensor elements to this crystal direction.

The Hall sensor array is usually implemented as a monolithic integrated component, which can also accommodate not only the Hall sensor array but also a current supply for the Hall sensor elements as well as an electronic evaluation circuit for the Hall voltage. Traditional silicon semiconductor technology employing known bipolar or MOS manufacturing processes generally provides the basis for manufacturing this circuit arrangement. With the arrangement according to the present invention the known disadvantages of silicon as a Hall sensor element material, i.e. a low Hall sensitivity and the big influence of the piezo effect, which leads to the sensor signal offset contribution, and also the influence of inhomogeneities in the semiconductor material, can substantially be overcome.

With the parallel connection of the respective contact electrodes K1, K2, K3, K4 of the individual Hall sensor elements, which has been described above, only four output terminals are provided in the Hall sensor array treated here. With relatively simple circuitry it is possible to switch between these from one measurement phase to the next and to connect them to the evaluation electronics. With this fixed wiring it is possible not only to achieve the advantages as regards offset compensation described above but also to keep the circuitry simple, thus making possible a simpler and therefore cheaper fabrication of these Hall sensor arrays compared with traditional Hall sensors.

To clarify she concept according to the present invention some examples of other alternative arrangements so the Hall sensor elements according to the present invention are described below. It should be noted that the Hall sensor elements of a pair must be geometrically identical to each other, whereas, on the other hand, the Hall sensor elements of different pairs may have different geometries. Thus additional optimization can be achieved for individual applications or areas of application of the Hall sensor array.

Figure 2A:
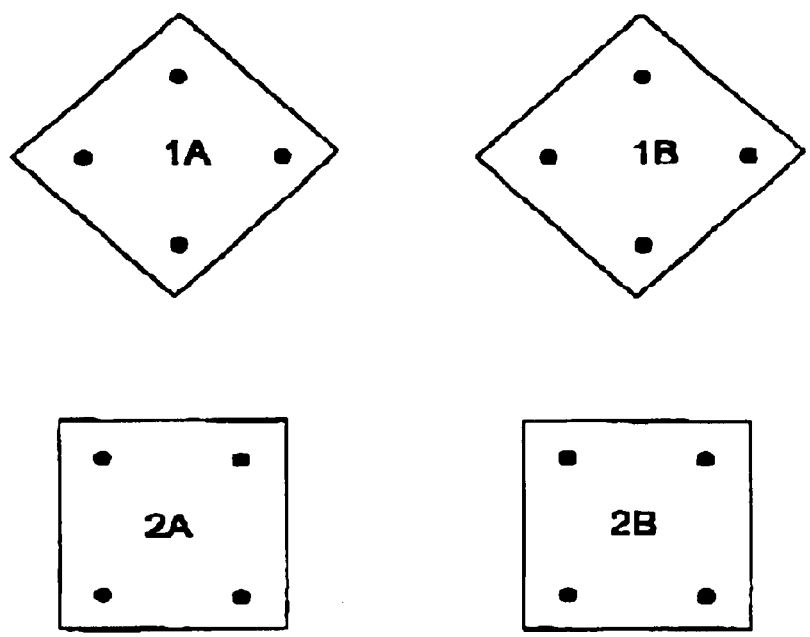
FIGS. 2a–c show schematic representations of further alternative geometrical embodiments and arrangements of the Hall sensor elements according to the present invention.

In FIG. 2a the Hall sensor element pairs 1A, 1B and 2A, 2B are respectively arranged next to one another and the Hall sensor elements of both pairs have the same geometric form.

Figure 2B:
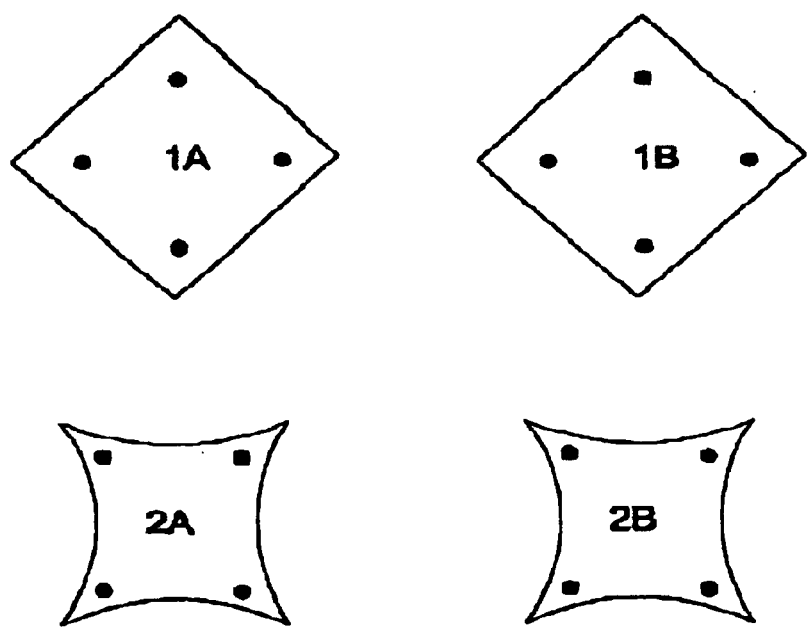

In FIG. 2b the Hall sensor element pairs 1A, 1B and 2A, 2B are respectively arranged next to one another and the Hall sensor elements of both pairs have different geometric forms.

Figure 2C:
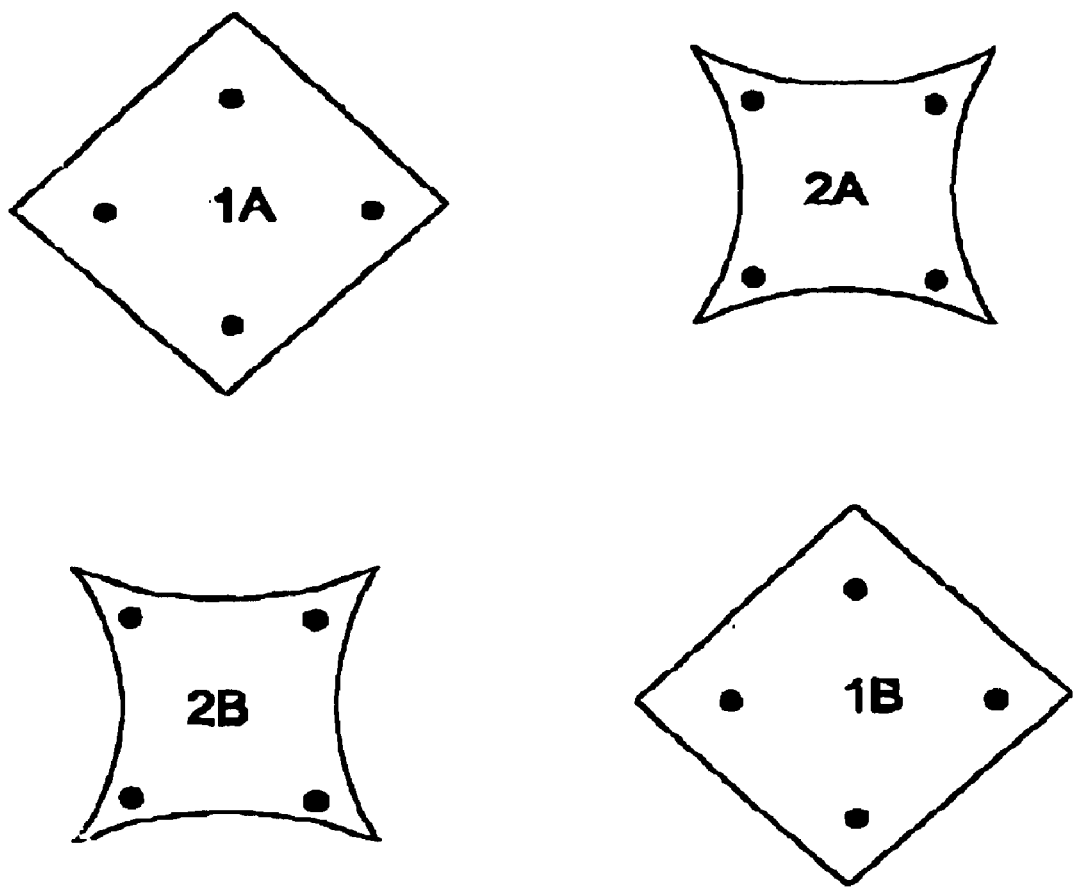

In FIG. 2c the Hall sensor element pairs 1A, 1B and 2A, 2B are respectively arranged diagonally and the Hall sensor elements of both pairs have different geometric forms.

A further advantageous possibility for the geometric arrangement of the individual Hall sensor element pairs is to place the Hall sensor elements so that the midpoints of the individual Hall sensor elements lie on a circle.

Figure 3A:
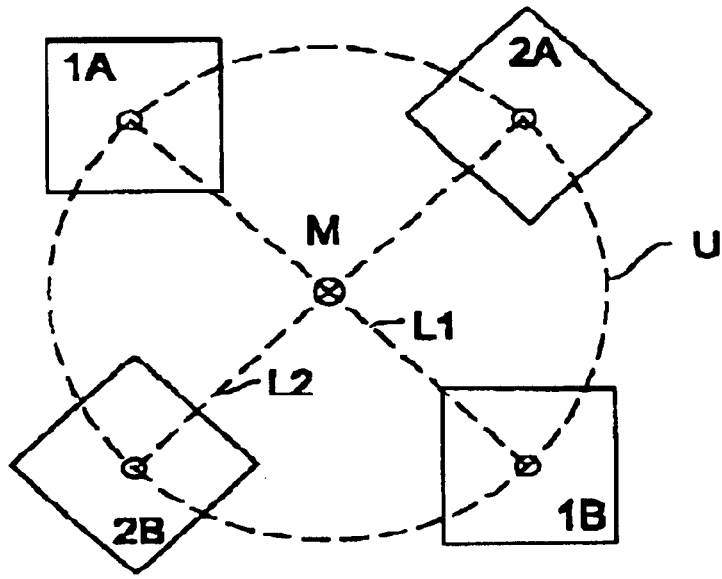
FIGS. 3a–b show schematic representations of further alternative geometrical arrangements of the Hall sensor elements according to the present invention.

An example of the geometric arrangement for two pairs of Hall sensor elements 1A, 1B and 2A, 2B is shown in FIG. 3a. Connecting lines L1, L2 represent the imaginary connection between the geometric midpoints of the two Hall sensor elements of a pair. The connecting lines L1, L2 of the two pairs of Hall sensor elements 1A, 1B and 2A, 2B intersect at a point M, which represents the geometric midpoint of the whole Hall sensor array. In this geometric arrangement the midpoints of the individual Hall sensor elements 1A, 1B and 2A, 2B lie symmetrically on an imaginary circle U with midpoint M.

Figure 3B:
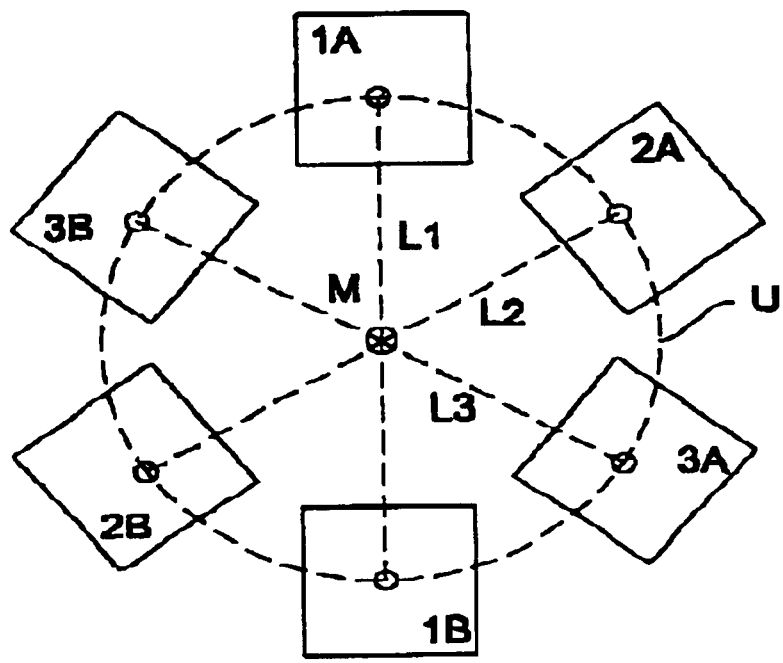

FIG. 3b shows an example of a geometric arrangement for three pairs of Hall sensor elements. Connecting lines L1, L2, L3 represent the imaginary connection between the geometric midpoints of the two Hall sensor elements of a pair. The connecting lines L1, L2, L3 of the three pairs of Hall sensor elements 1A, 1B, 2A, 2B, 3A, 3B intersect at a point M, which represents the geometric midpoint of the whole Hall sensor array. In this geometric arrangement the midpoints of the individual Hall sensor elements 1A, 1B, 2A, 2B, 3A, 3B lie symmetrically on an imaginary circle U with midpoint M.

All the Hall sensor arrays described above provide the advantages as regards simplified circuitry demands and improved offset properties described herein.

What is claimed is:

1. Hall sensor array comprising:
    a first and at least one additional pair of Hall sensor elements,
    wherein each hall sensor element has four terminals, of which two terminals act as power supply terminals for supplying an operating current and two terminals act as measurement terminals for measuring a Hall voltage,
    wherein the Hall sensor elements are so arranged that the current directions of the operating current in the two Hall sensor elements of each pair are offset at an angle of approximately 90° to one another,
    wherein the Hall sensor elements of the additional pair(s) are so arranged that their current directions of the operating current are offset at an angle of approximately 90°/n to the current directions of the operating current of the first pair of Hall sensor elements, n being the total number of Hall sensor element pairs, and
    wherein respective first terminals of the measurement terminals of the Hall sensor elements and respective second terminals of the measurement terminals of the Hall sensor elements are connected together for measurement of the Hall voltage,
    wherein the Hall sensor array also has switches and wherein the respective terminals of the Hall sensor elements are connected to the switches, so that the respective first and second supply terminals for supplying an operating current and the respective first and second measurement terminals for measuring a Hall voltage can be switched over from one measurement to a subsequent measurement in such a way that the current directions of the operating current in the Hall sensor elements and the Hall voltage tapping directions can be rotated through approximately 90° from one measurement to a subsequent measurement,
    wherein the Hall sensor array also has a controller by means of which the switches are controllable in such a way that the Hall sensor array is operable in spinning current operation for generating a Hall signal and wherein the offset voltages of the Hall sensor elements approximately cancel one another out in a revolution so that the Hall signal contributions which actually depend on the magnetic field remain, and
    wherein respective first supply terminals of each Hall sensor element are connected together and to a first terminal of a common voltage source and respective second supply terminals of each Hall sensor element are connected together and to the second terminal of the common voltage source so that the common voltage source supplies an operating current for the Hall sensor elements.

2. Hall sensor array according to claim 1, wherein the first supply terminals are connected together electrically by being interwired, the second supply terminals are connected together electrically by being interwired, the first measurement terminals are connected together electrically by being interwired and the second measurement terminals are connected together electrically by being interwired.

3. Hall sensor array according to claim 1, wherein the Hall sensor elements of a pair are geometrically identical.

4. Hall sensor array according to claim 1, wherein the Hall sensor elements of different pairs are geometrically different.

* * * * *